United States Patent
Tanaka

(10) Patent No.: US 6,838,808 B2
(45) Date of Patent: Jan. 4, 2005

(54) STAGE-ACTUATORS THAT DO NOT GENERATE FLUCTUATING MAGNETIC FIELDS, AND STAGE DEVICES COMPRISING SAME

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 81 days.

(21) Appl. No.: 10/360,886

(22) Filed: Feb. 7, 2003

(65) Prior Publication Data

US 2003/0226976 A1 Dec. 11, 2003

(30) Foreign Application Priority Data

Feb. 14, 2002 (JP) ........................................ 2002-036147

(51) Int. Cl.[7] .............................................. H01L 41/08
(52) U.S. Cl. ...................................................... 310/328
(58) Field of Search ................................ 310/328, 323, 310/311, 331, 332, 338, 342, 354, 316, 317; 353/153; 359/845; H01L 41/08, 37/20

(56) References Cited

U.S. PATENT DOCUMENTS

| | | | | |
|---|---|---|---|---|
| 4,525,852 A | * | 7/1985 | Rosenberg | ................... 310/328 |
| 5,332,942 A | * | 7/1994 | Rennex | ....................... 310/328 |
| 6,337,532 B1 | * | 1/2002 | Johansson et al. | ...... 310/323.02 |
| 6,437,485 B1 | * | 8/2002 | Johansson | ................... 310/332 |
| 6,583,597 B2 | * | 6/2003 | Tanaka et al. | ............... 318/687 |
| 6,674,085 B2 | | 1/2004 | Miura et al. | |
| 2002/0180312 A1 | | 12/2002 | Tanaka | |

FOREIGN PATENT DOCUMENTS

JP          2003318081       * 7/2003   ........... H01L/21/27

* cited by examiner

*Primary Examiner*—Thomas M. Dougherty
*Assistant Examiner*—Karen Addison
(74) *Attorney, Agent, or Firm*—Klarquist Sparkman, LLP

(57) ABSTRACT

Stage devices are disclosed having especial utility in certain types of microlithography systems. The stage devices impart controlled motion to a stage or platform without generating fluctuating electromagnetic fields. The stage devices include stage-actuators that do not rely on electromagnetics for operation. Multiple stage-actuators achieve motion of a slider relative to a guide bar. Each stage-actuator includes at least two actuator-portions that collectively provide an "inchworm" walking manner of motion of the slider relative to the guide bar. Each actuator-portion includes a respective pressure-application member. The pressure-application members are selectively actuated so as to engage a respective guide bar in a coordinated manner that serves to "push" the slider along the guide bar. Each actuator-portion includes a respective first piezoelectric element that urges the respective pressure-application member against the guide bar and retracts the pressure-application member from the guide bar, and a respective second piezoelectric element that moves the respective pressure-application member in the longitudinal direction of the guide bar.

30 Claims, 5 Drawing Sheets

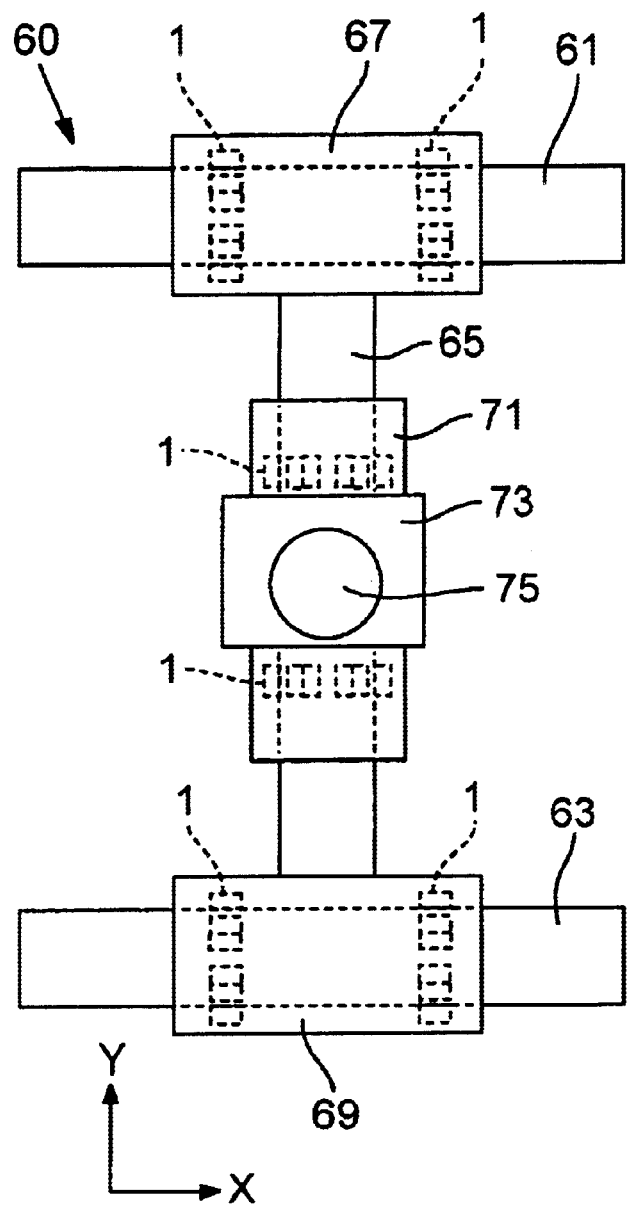
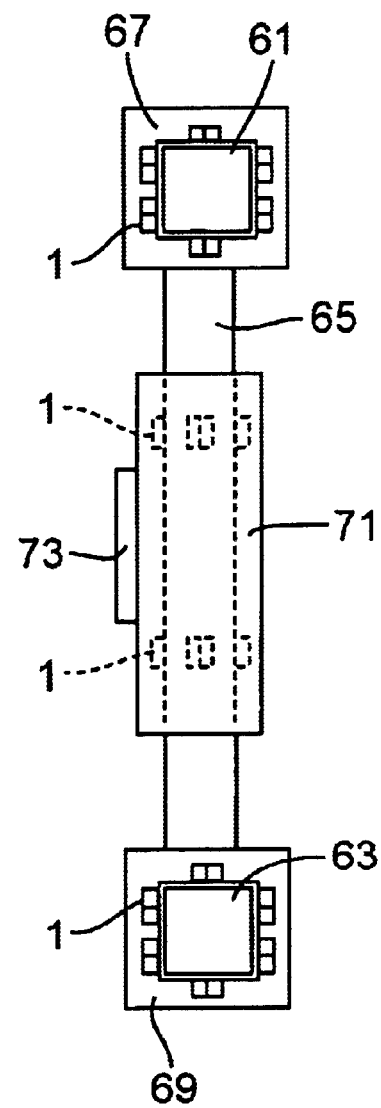
FIG. 5(a)
FIG. 5(b)

US 6,838,808 B2

STAGE-ACTUATORS THAT DO NOT GENERATE FLUCTUATING MAGNETIC FIELDS, AND STAGE DEVICES COMPRISING SAME

FIELD

This disclosure pertains to stage devices, especially stage devices configured for holding a pattern-defining reticle or a lithographic substrate in a microlithography system. Microlithography is a key technology used in the fabrication of microelectronic devices such as semiconductor integrated circuits, displays, micromachines, and the like. Because they do not operate electromagnetically, the subject stage devices do not generate stray or fluctuating magnetic fields. Hence, the stage devices are particularly suitable for use in charged-particle-beam (CPB) microlithography systems that are sensitive to beam-perturbations caused by stray magnetic fields, including stray magnetic fields generated by stage-actuators in a stage device.

BACKGROUND

Various microlithography systems (especially such systems used for fabricating semiconductor devices) include at least one stage device that holds a lithographic substrate (e.g., resist-coated semiconductor wafer). If the system utilizes a pattern-defining reticle, then the system typically also comprises a "reticle stage" for holding the reticle. A stage device not only holds the respective object (reticle or substrate) but also facilitates high-velocity movements and high-accuracy placements of the object as required during exposure. For certain types of microlithography (notably charged-particle-beam (CPB) and X-ray microlithography systems) the stage(s) must be capable of operation in a high-vacuum environment.

Stage devices for microlithography systems have any of various configurations. Two common configurations are the so-called "H-type" and "I-type" configurations that provide X-Y movements of the object. Both of these types of stage devices include a moving guide bar extending (e.g, in the Y-direction) between two parallel fixed guide bars (extending, e.g., in the X-direction). The actual stage (platform) on which the object is mounted is attached to a "slider" that moves along the moving guide bar. The names of these types of stage devices reflect their respective plan profiles. For example, in the "H-type" stage device the legs of the "H" are defined by the fixed guide bars and the cross member of the "H" is defined by the moving guide bar. In the "I-type" stage device the stem of the "I" is defined by the moving guide bar and the top and bottom caps of the "I" are defined by the fixed guide bars. In most instances, H-type stage devices are used as substrate stages in which possible movements in the X- and Y-directions are relatively "long" strokes. I-type stage devices typically are used as reticle stages in which possible movement along only one of the X- and Y-directions is a relatively long stroke.

Recently, linear motors have been used as actuators in stage devices for imparting motions of the platform in the X- and Y-directions. Linear motors have many advantages such as relative simplicity and compactness of construction, relatively low mass, and high operational efficiency. However, in stage devices as used in CPB microlithography systems (e.g., electron-beam microlithography systems), use of linear motors causes certain problems. Specifically, a linear motor comprises a moving "reaction member" (also called a "rotor" even though it does not rotate) and a stator, one of which comprising a coil extending in both directions along the respective axis, and the other of which having an array of permanent magnets extending in both directions along the respective axis. Whenever a linear motor is used as the actuator of a slider on a moving guide bar, since the moving guide bar itself moves, the entire linear motor carried by the moving guide bar moves as the moving guide bar moves. As this linear motor moves, the array of permanent magnets (whether in the reaction member or in the stator) moves, which causes corresponding magnetic-field fluctuations in the environment of the charged particle beam as the beam is being used for making lithographic exposures. These magnetic-field fluctuations affect the trajectory of the beam, which prevents the beam from achieving a desired pattern-transfer accuracy of several nanometers on the substrate.

Hence, in a CPB microlithography system in which a stage is actuated by a linear motor, especially if the stator comprises the array of permanent magnets and the reaction member comprises the coil, at least the stator must be shielded by a magnetic shield made of a high permeability material. It also is necessary to provide a dynamic magnetic-field-cancellation device in the moving element. Use of shields and field-canceling devices is directed to the fields themselves, and complicates use of these types of stage devices in CPB microlithography systems. Also, shields and field-canceling devices add substantial complexity and cost, and also add substantial mass to the stage devices.

For these reasons, stage actuators that do not rely on electromagnetic fields are in demand for use in stages used in CPB microlithography systems. One type of non-magnetic actuator is a pneumatic cylinder that uses pressurized air or other gas to generate driving force. Unfortunately, use of a pneumatic cylinder in this manner causes stage motions to be non-linear in their manner of control, which requires implementation of an offsetting linearized compensation scheme to achieve satisfactory motion control. In addition, in view of the relationship between flow volume and pressure in the pneumatic cylinder, it is difficult to increase the range over which movements can be controlled accurately, in contrast to use of a linear motor. Hence, other types of non-electromagnetic actuators are needed.

In certain conventional stage devices as used in microlithography systems, long-stroke stage motions have been achieved using ultrasonic linear actuators. Unfortunately, ultrasonic linear actuators generate vibrations, which can cause problems in exposure accuracy and precision. Also, magnetostriction-based actuators have been considered that move a stage in an inchworm "walking" manner (since individual element displacements are very small). In this regard, see Japan Kôkai Patent Document No. Hei 11-178368. However, neither of these approaches has exhibited satisfactory performance to date.

SUMMARY

In view of the shortcomings of conventional stage devices as summarized above, this present invention provides, inter alia, stage devices, and microlithography systems comprising at least one stage device, in which stage-movement actuation is achieved by using non-electromagnetic actuators having simple structure and superior controllability, compared to conventional stage devices.

According to a first aspect of the invention, stage devices are provided. An embodiment of such a stage device comprises a guide bar, a slider, a stage, and multiple stage actuators. The guide bar extends in a longitudinal dimension. The slider is movable in the longitudinal dimension as guided by the guide bar and is positionable along the longitudinal dimension of the guide bar. The stage is mounted to the slider. The multiple stage-actuators are attached to the slider and extend toward a guide surface of the guide bar. The stage-actuators are operable in a coordinated manner to cause motion of the slider, relative to the guide bar, in a stage-movement direction parallel to the longitudinal dimension. Each stage-actuator comprises a first piezoelectric element, a second piezoelectric element, and a pressure-application member having a contact surface and that is movable by changes in shape of either or both the first and second piezoelectric elements. The first piezoelectric element is configured to expand, when electrically energized, in a manner that moves the pressure-application member toward the guide surface so as to cause the contact surface to contact the guide surface, and to retract, when the first piezoelectric element is electrically de-energized, the pressure-application member away from the guide surface. The second piezoelectric element is configured to exhibit, when electrically energized, a shear deformation that displaces the pressure-application member and contact surface in the stage-movement direction, and not to exhibit, when electrically de-energized, the shear deformation. The first and second piezoelectric elements are energizable in an independent but coordinated manner so as to cause the contact surface periodically to contact and not contact the guide surface in a walking "inchworm" manner that urges movement of the slider relative to the guide bar in the stage-movement direction.

The stage-actuators desirably are arranged in pairs that are operated cooperatively to cause their respective contact surfaces to exhibit a coordinated walking motion relative to the guide surface. Each of the stage-actuators in each pair desirably is energized in an operational sequence that is 180° out of phase with the operational sequence of the other stage-actuator. In each of the stage-actuators in each pair, the first and second piezoelectric elements desirably are energized in respective operational sequences that are 90° out of phase with each other.

With respect to each of the stage-actuators, the first piezoelectric element desirably is mounted to the slider. The second piezoelectric element is mounted to the first piezoelectric element, and the pressure-application member is mounted to the second piezoelectric element. Desirably, the first piezoelectric element, second piezoelectric element, and pressure-application member desirably are superposedly stacked relative to each other.

The guide bar can define at least two opposing guide surfaces extending in the longitudinal dimension. In this configuration, the slider moves along and is guided by both guide surfaces, and the stage-actuators are arranged in pairs each consisting of a respective two stage-actuators. Thus, the stage-actuators are situated so as to stabilize motion of the slider along the guide bar. At least one pair of stage-actuators is situated so as to perform a respective walking movement of the slider along each respective guide surface. Each of the stage-actuators in each pair desirably is energized in an operational sequence that is 180° out of phase with the operational sequence of the other stage-actuator of the pair. The stage device desirably includes multiple pairs of stage-actuators situated so as to perform respective coordinated walking movements of the slider along each respective guide surface.

The stage device further can comprise multiple guide bars and respective sliders, wherein each guide bar has a respective longitudinal dimension. Each slider is movable in the longitudinal dimension of the respective guide bar as guided by the respective guide bar and is positionable along the longitudinal dimension of the respective guide bar. This stage device further can comprise multiple of the stage-actuators attached to each slider and extending toward the guide surface of the respective guide bar. The stage-actuators desirably are operable in a coordinated manner to cause motion of the slider, relative to the respective guide bar, in a stage-movement direction parallel to the respective longitudinal dimension. At least two of the multiple guide bars can be parallel to each other. Alternatively or in addition, the respective longitudinal dimension of at least one guide bar can be orthogonal to the respective longitudinal dimension of another of the guide bars. This latter configuration is especially useful for reticle stages and substrate stages as used in microlithography systems.

According to another aspect of the invention, planar stage devices are provided. An embodiment of such a stage device comprises a planar first guide plate, a slider plate, as stage, and multiple stage-actuators. The first guide plate defines a respective guide surface extending in a respective guide plane. The slider plate is movable in the guide plane relative to the first guide plate as guided by the first guide plate. The stage is mounted to the slider plate. The multiple stage-actuators are attached to the slider plate and extend toward the guide surface of the first guide plate such that the stage-actuators are situated between the slider plate and the first guide plate. The stage-actuators are operable in a coordinated manner to cause motion of the slider plate, relative to the first guide plate, in a stage-movement direction in the guide plane. Each stage-actuator desirably is structured and configured as summarized above, and is energizable in a coordinated manner so as to cause its respective contact surface periodically to contact and not contact the guide surface in a walking manner that urges movement of the slider plate relative to the first guide plate. The stage-actuators desirably are arranged in pairs that are operated cooperatively to cause their respective contact surfaces to exhibit a coordinated walking motion relative to the guide surface. Each of the stage-actuators in each pair desirably is energized in an operational sequence that is 180° out of phase with the operational sequence of the other stage-actuator. In each of the stage-actuators in each pair, the first and second piezoelectric elements desirably are energized in respective operational sequences that are 90° out of phase with each other.

This stage device further can comprise a second planar guide plate defining a respective guide surface extending parallel to and facing the guide surface of the first guide plate. The slider plate is situated between the respective guide surfaces of the first and second guide plates. The slider plate has a first surface facing the guide surface of the first guide plate, and a second surface facing the guide surface of the second guide plate. Each of the first and second guide surfaces of the slider plate desirably has mounted thereto multiple stage-actuators that are situated and configured to perform, in a coordinated manner, walking movements of the slider plate relative to the first and second guide plates. Further desirably, the stage-actuators are arranged in pairs each consisting of a respective two stage-actuators. At least one pair of stage-actuators is situated so as to perform a respective walking movement of the slider plate along the respective guide surface. As noted above, each of the stage-actuators in each pair desirably is energized in an operational sequence that is 180° out of phase with the operational sequence of the other stage-actuator of the pair.

Each of the first and second surfaces of the slider plate desirably comprises multiple pairs of stage-actuators situated so as to perform respective coordinated walking movements of the slider plate relative to the first and second guide plates. In this configuration the guide plane extends, for example, in the X- and Y-directions. On each of the first and second surfaces of the slider plate, a first set of the multiple pairs of stage-actuators is situated so as to move the slider plate in the X-direction, and a second set of the multiple pairs of stage-actuators is situated so as to move the slider plate in the Y-direction.

According to another aspect of the invention, microlithography systems are provided that selectively irradiate an energy beam onto a sensitive substrate to form a pattern. Such systems include at least one stage device as summarized above. The stage can be, for example, a reticle stage and/or a substrate stage.

The foregoing and additional features and advantages of the invention will be more readily apparent from the following detailed description, which proceeds with reference to the accompanying drawings.

BRIEF DESCRIPTION OF THE DRAWINGS

FIGS. 5(A)–5(B) are a plan view and orthogonal view, respectively, of a first representative embodiment of a stage device.

DETAILED DESCRIPTION

Various aspects and details of the invention are set forth in the context of representative embodiments that are not intended to be limiting in any way. Also, the embodiments are described in the context of an electron-beam microlithography system as a representative charged-particle-beam (CPB) microlithography system. However, it will be understood that the principles of the invention are applicable to any of various other microlithography systems, including ion-beam systems, EUV systems, and other systems requiring a vacuum chamber for establishing a suitable propagation environment for the beam. Also, in the following discussion, certain words are used to denote relative positional relationships (e.g., "upper," "lower," "left," and "right") shown in the figures. These words are used to facilitate descriptions of features as shown in the figures, but are not intended to be limiting. Any of various other positional relationships are possible.

Figure 4:
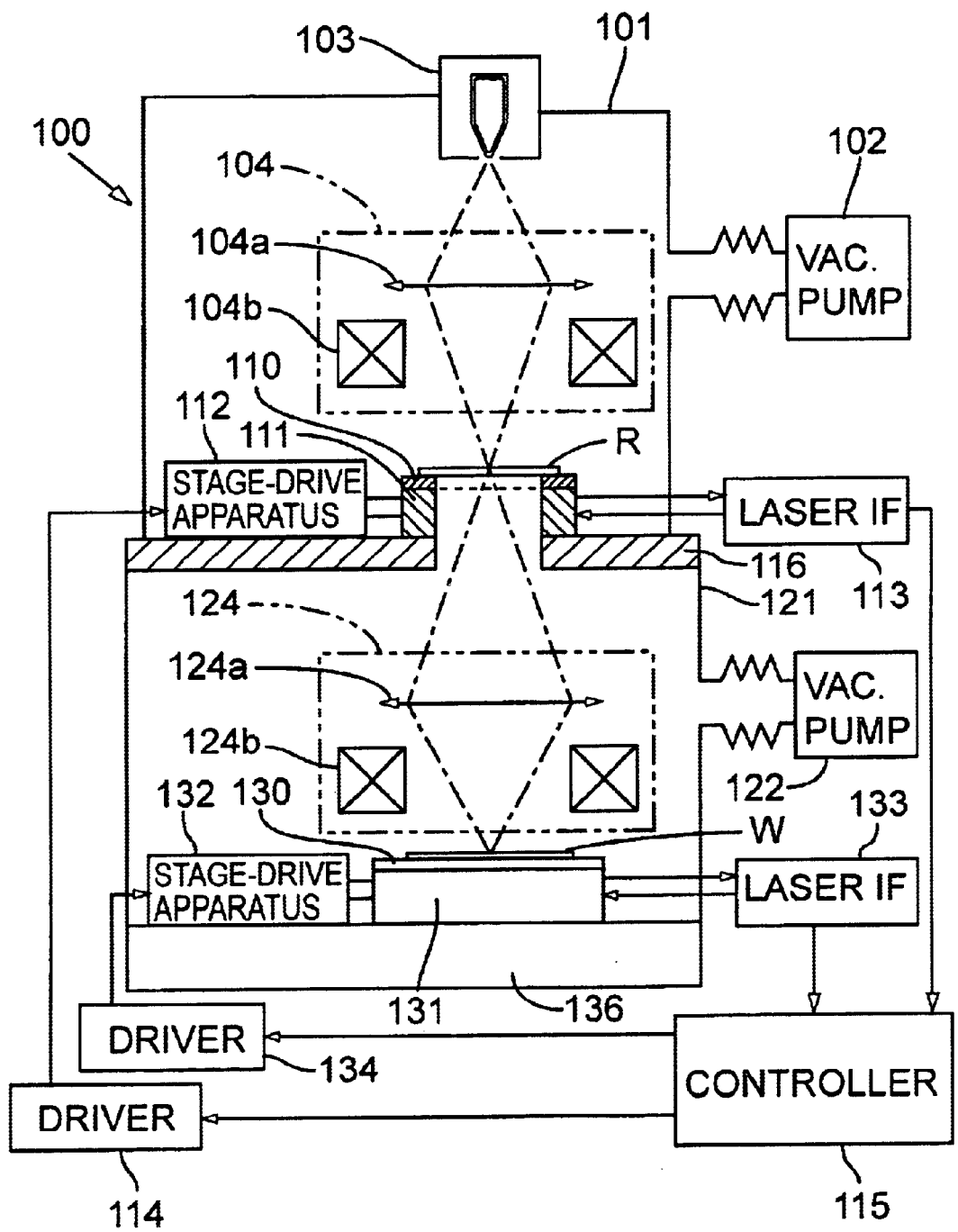
FIG. 4 is a schematic elevational diagram of a representative embodiment of a charged-particle-beam microlithography system (notably an electron-beam system) comprising a stage device including an actuator as disclosed herein.

An embodiment of an electron-beam microlithography system 100, comprising at least one stage device, is shown schematically as an elevational view in FIG. 4. The "upper" portion of the system 100 is enclosed in a "lens column" (first vacuum chamber) 101 to which a vacuum pump 102 is connected. The vacuum pump 102 evacuates the lens column 101 to a suitable vacuum level.

An electron gun 103 is disposed at the upstream end of the lens column 101 and emits an electron beam that propagates in a downstream direction (downward in the figure). Downstream of the electron gun 103 are an illumination-optical system 104 (comprising a condenser lens 104a and deflector 104b, etc.) and a reticle R. The electron beam emitted from the electron gun 103 is converged by the condenser lens 104a. The electron beam is scanned in the lateral direction in the drawing by the deflector 104b so as to illuminate a row of multiple individual exposure units ("subfields") of the reticle R in a scanning, sequential manner. The length of the row is approximately equal to the width of the optical field of the illumination-optical system 104. Although in the figure the illumination-optical system 104 is depicted as having a single condenser lens 104a, it will be understood that an actual illumination-optical system comprises multiple condenser lenses, multiple deflectors, a beam-shaping aperture, a blanking aperture, and other components.

The reticle R is secured to a chuck 110, mounted to an upper surface of a reticle stage 111, by electrostatic adhesion or the like. The reticle stage 111 is mounted on a mounting plate 116, relative to which the reticle stage 111 is movable.

The reticle stage 111 includes at least one stage-actuator 112 (shown at left in the figure). (The stage-actuator 112 is incorporated into the stage 111, as described later below, and is operable to move the reticle stage 111 relative to the mounting plate 116.) The stage-actuator 112 is connected to a controller 115 via a respective stage-driver 114, the latter comprising electronic circuitry required for driving the stage-actuator 112. Also associated with the reticle stage 111 is a respective laser interferometer (IF) 113 that provides accurate data concerning the position of the reticle stage 111. The data are routed to the controller 115 to which the laser interferometer 113 is connected. The controller 115 processes the data and routes commands to the stage-driver 114 as required to cause the stage-actuator 112 to position the reticle stage 111 at a desired or appropriate target position. Thus, the position of the reticle stage 111 is feedback-controlled accurately and in real time.

A substrate chamber (second vacuum chamber) 121 is situated downstream of the mounting plate 116 and is connected to a respective vacuum pump 122. The vacuum pump 122 evacuates the substrate chamber 121 to a desired vacuum level. Situated inside the substrate chamber 121 is a projection-optical system 124 that includes a projection lens 124a and a deflector 124b. Although in the figure the projection-optical system 124 is depicted as having a single projection lens 124a, it will be understood that an actual projection-optical system comprises multiple projection lenses, multiple deflectors, apertures, and other components, including components used for aberration correction. Also situated inside the substrate chamber, downstream of the projection-optical system 124, is a substrate stage 131 to which an exposure-sensitive substrate (typically a resist-coated wafer) W is mounted for exposure.

The portion of the electron beam passing through the reticle R is patterned by such passage, and thus the beam propagating downstream of the reticle R carries an aerial image of the illuminated region of the reticle R. This "patterned" beam is converged by the condenser lens 124a and deflected as required by the deflector 124b so as to form a focused actual image of the illuminated region of the reticle R at a predetermined position on the substrate W.

The substrate W is secured to a chuck 130, mounted to an "upper" surface of a substrate stage 131, by electrostatic adhesion or the like. The substrate stage 131 is mounted on a mounting plate 136, relative to which the substrate stage 131 is movable.

The substrate stage 131 includes at least one stage-actuator 132 (shown at left in the figure). (The stage-actuator 132 is incorporated into the stage 131, as discussed later below.) The stage-actuator 132 is operable to move the substrate stage 131 relative to the mounting plate 136. The stage-actuator 132 is connected to the controller 115 via a respective stage-driver 134, the latter comprising electronic circuitry required for driving the stage-actuator 132. Also associated with the substrate stage 131 is a respective laser interferometer (IF) 133 that provides accurate data concerning the position of the substrate stage 131. The data are routed to the controller 115 to which the laser interferometer 133 is connected. The controller 115 processes the data and routes commands to the stage-driver 134 as required to cause the stage-actuator 132 to position the substrate stage 131 at a desired or appropriate target position. Thus, the position of the substrate stage 131 is feedback-controlled accurately and in real time.

Figure 1:
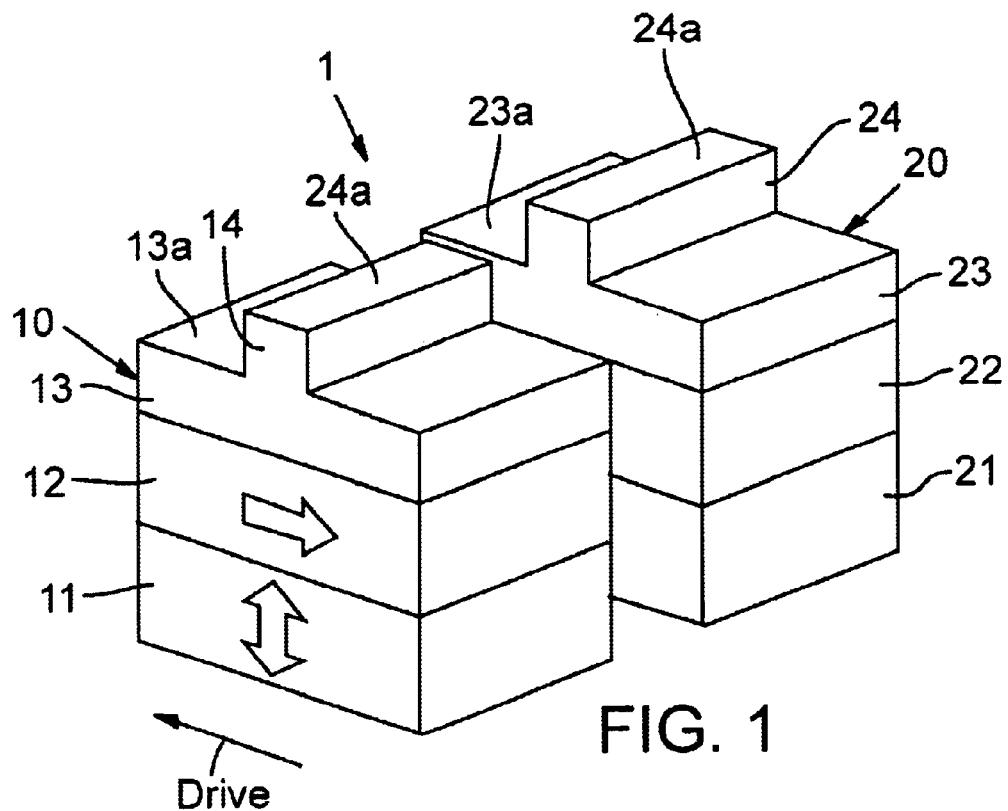
FIG. 1 is an oblique view schematically depicting the structure of a stage-actuator according to a first representative embodiment.

Reference now is made to FIG. 1, which shows a representative embodiment of a stage-actuator 1 that can be used to impart movement to a stage (e.g., reticle stage or substrate stage) or other object, as noted above. The stage-actuator 1 comprises multiple (e.g., two) actuator-portions 10, 20 having similar structure and function. The stage-actuator 1 drives an object (e.g., stage), supported by the stage-actuator, in the directions indicated by the large arrows in the figure. Each actuator-portion 10, 20 has a three-part configuration formed by a respective first (vertical-drive) piezoelectric element 11, 21, a respective second (horizontal-drive) piezoelectric element 12, 22, and a respective pressure-application member 13, 23. The elements 11, 21 and 12, 22 and members 13, 23 have the same respective structures and properties. The actuator-portions 10, 20 are arranged parallel to each other, with a prescribed gap therebetween extending in a direction perpendicular to either of the drive directions.

Piezoelectric elements typically are not magnetic and typically do not include magnetic material. Hence, they are especially useful as actuators in situations in which stray magnetic fields are not desired. Also, piezoelectric elements exhibit excellent resolution of positioning and excellent responsiveness. Recently developed piezoelectric elements exhibit high deformation when actuated, making them especially useful as the piezoelectric elements 11, 12, 21, 22.

The first piezoelectric elements 11, 21 and second piezoelectric elements 12, 22 have similar forms, namely a rectangular parallelepiped form. Each of these elements 11, 21, 12, 22 is connected electrically to a power source (not shown) that, in turn, is connected to the controller 115 (not shown in FIG. 1, but see FIG. 4). The controller routes commands to the power source that cause the power source to apply, at the correct moment during an operational sequence, respective voltages each at a respective prescribed polarity to the piezoelectric elements 11, 21, 12, 22.

Whenever a respective voltage of a prescribed polarity is applied to one of the first piezoelectric elements 11, 21, the element 11, 21 elongates in a direction perpendicular to the stage-drive direction (elongation is "vertical" in the figure, as indicated by the large arrow). When power to the elements 11, 21 is turned off, the elements return to their respective initial (pre-elongation) shapes. Similarly, whenever a respective voltage of a prescribed polarity is applied to one of the second piezoelectric elements 12, 22, the element exhibits a shear deformation (and hence displacement) in a direction parallel to the stage-drive direction (displacement direction is "horizontal" in the figure, as indicated by the large arrow). The shear deformation is manifest as a respective warp in the side profile of the respective element 12, 22 from rectangular to parallelepiped. When power to the elements 12, 22 is turned off, the elements return to their respective initial (pre-deformation) shapes. Reversing the polarity of the respective applied voltage to any of the elements 11, 21, 12, 22 causes displacement in an opposite direction than realized with voltage of the other polarity.

The pressure-application members 13 and 23 desirably have the same respective planar profiles as the respective piezoelectric elements 11, 12 and 21, 22. Each pressure-application member 13, 23 also has a respective protruding portion 14, 24 extending, in the figure, vertically upward from a respective upper surface 13a, 23a. The protruding portions 14, 24 extend perpendicularly to the stage-drive direction. Each protruding portion 14, 24 has a respective planar "upper" surface 14a, 24a.

The stage-actuator 1 of FIG. 1 operates according to a sequence as diagrammed in FIGS. 2(A)–2(D). In general, the stage-actuator 1 moves a slider 51, relative to a guide bar 53, along the longitudinal direction of the guide bar 53 (note horizontal arrow). To achieve this motion, both actuator-portions 10, 20 operate in a coordinated manner. The "lower" surfaces of the first piezoelectric elements 11, 21 of the respective actuator-portions 10, 20 are secured to the slider 51. The actuator-portions 10, 20 of a stage-actuator 1 typically are positioned side-by-side and extend perpendicularly to the slider-movement direction. In FIGS. 2(A)–2(D) the actuator-portions 10, 20 are shown divided left and right, respectively, to facilitate comprehension of their operation. The actuator-portions 10, 20 also are positioned so that the respective second piezoelectric elements 12, 22 deform in a direction opposite the slider-movement direction. Also, the protruding portions 14, 24 of the pressure-application members 13, 23 retract in a direction perpendicular to the slider-movement direction. In a "relaxed" state (in which voltage is not being supplied to any of the respective piezoelectric elements 11, 21, 12, 22), as shown on the right side of FIG. 2(B) and on the left side of FIG. 2(D), the upper surfaces 14a, 24a of the protruding portions 14, 24 are retracted from the surface 53a of the guide bar 53.

In the following description only the principles of moving the slider 51 relative to the guide bar 53 are explained. Operational details of the actuator-portions will be discussed later.

First, a voltage of the prescribed polarity is applied to the first piezoelectric element 11 of the first actuator-portion 10. As shown on the left in FIG. 2(A), this applied voltage causes the first piezoelectric element 11 of the first actuator-portion 10 to elongate in the "vertical" direction, urging the "upper" surface 14a of the pressure-application member 13 against the surface 53a of the guide bar 53. Meanwhile, as shown on the right in FIG. 2(A), power to the first piezoelectric element 21 is turned off, causing the "upper" surface 24a of the pressure-application member 23 in the second actuator-portion 20 to retract ("vertically" downward in the figure) away from the surface 53a of the guide bar 53.

Next, as voltage is being applied to the first piezoelectric element 11, voltage of the prescribed polarity also is applied to the second piezoelectric element 12 of the first actuator-portion 10. As shown on the left in FIG. 2(B), this voltage (applied while the upper surface 14a is in contact with the surface 53a of the guide bar 53) causes the second piezoelectric element 12 to exhibit a shear deformation to the right, opposite the drive direction. Meanwhile, as shown on the right in FIG. 2(B), power to the second piezoelectric element 22 of the second actuator-portion 20 is turned off, allowing movement (to the left in the figure) of the "upper" surface 24*a* relative to the guide bar 53. Hence, as the second piezoelectric element 12 deforms in a direction opposite the drive direction while the upper surface 14*a* of the first actuator-portion 10 is urged against the surface 53*a* of the guide bar 53, a force is generated that "pushes" the slider 51 with attached actuator-portions 10, 20 to the left relative to the guide bar 53. As a result, the slider 51 advances in a "forward" direction as indicated by the bold arrow in FIG. 2(B). A high coefficient of friction exists between the upper surface 14*a* and the surface 53*a* of the guide bar 53, which prevents slippage of the pressure-application member 13 relative to the guide bar 53.

Figure 2A:
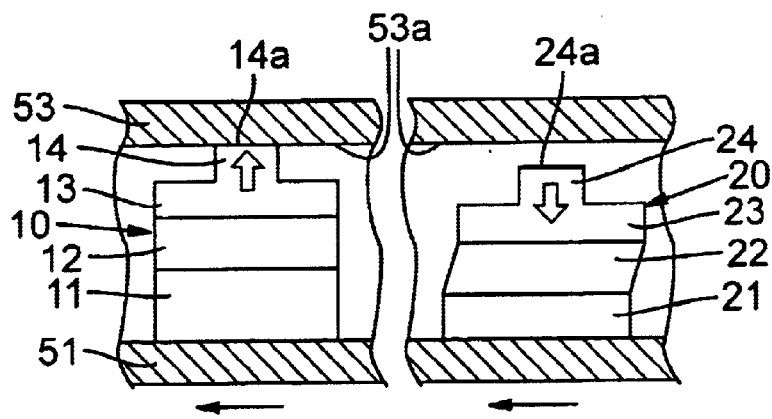
FIGS. 2(A)–2(D) depict respective steps in a stage-movement sequence involving the stage-actuator of FIG. 1.
Figure 2B:
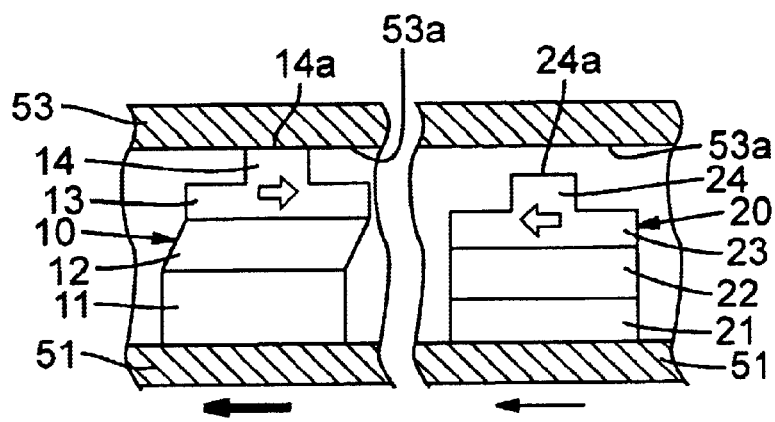
Figure 2C:
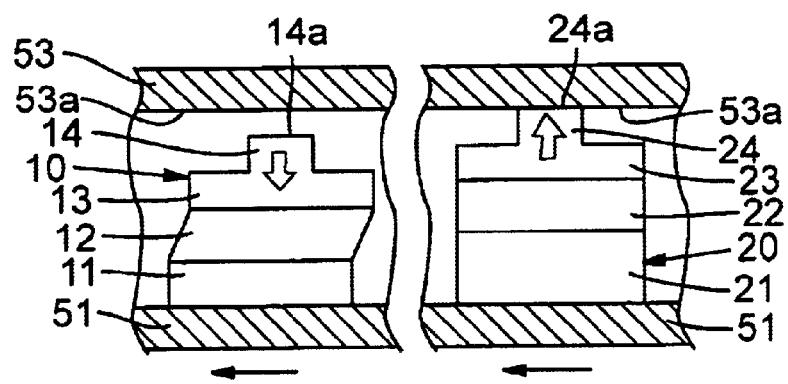

When voltage to the first piezoelectric element 11 is turned off, as shown on the left in FIG. 2(C), the first piezoelectric element 11 contracts in the "vertical" direction. As a result, the "upper" surface 14*a* of the pressure-application member 13 retracts from the surface 53*a* of the guide bar 53. Simultaneously (or slightly earlier), a voltage having a prescribed polarity is applied to the first piezoelectric element 21 of the second portion 20, causing the first piezoelectric element 21 to elongate in the "vertical" direction, as shown at right in FIG. 2(C). This elongation urges the "upper" surface 24*a* of the pressure-application member 23 against the surface 53*a* of the guide bar 53.

Next, while voltage is being applied to the first piezoelectric element 21, a voltage having the prescribed polarity is applied to the second piezoelectric element 22 of the same portion 20. As shown on the right in FIG. 2(D), these respective applied voltages urge the "upper" surface 24*a* of the pressure-application member 23 against the surface 53*a* of the guide bar 53. Meanwhile, the second piezoelectric element 22 undergoes a shear deformation in a direction (to the right in the figure) opposite the drive direction. This deformation of the second piezoelectric element 22 in a direction opposite the drive direction while the upper surface 24*a* of the pressure-application member 23 is being urged against the surface 53*a* of the guide bar 53 generates a force that pushes the slider 51 (along with the first and second actuator-portions 10, 20) relative to the guide bar 53. As a result, the slider 51 advances in the "forward" direction, as indicated by the bold arrow in FIG. 2(D). Again, a high coefficient of friction exists between the upper surface 24*a* and the surface 53*a* of the guide bar 53.

Thus, by performing selective "vertical" elongation of the first piezoelectric elements 11, 21 of the respective actuator-portions 10, 20, the respective upper surfaces 14*a*, 24*a* are selectively brought into frictional contact with the surface 53*a* of the guide bar 53. Also, by causing selective shear-deformation of the second piezoelectric elements 12, 22 in directions opposite the stage-movement direction, the slider 51 is displaced along and relative to the guide bar 53. Note that the respective areas of the upper surfaces 14*a*, 24*a* are smaller than the transverse area of the respective actuator-portions 10, 20. Also, the length of each upper surface 14*a*, 24*a* in the slider-movement direction is small. Thus, good contact of the upper surfaces 14*a*, 24*a* with the respective surfaces 53*a* is assured even if the surfaces 14*a*, 24*a* are not exactly parallel to the respective surfaces 53*a*.

Figure 3:
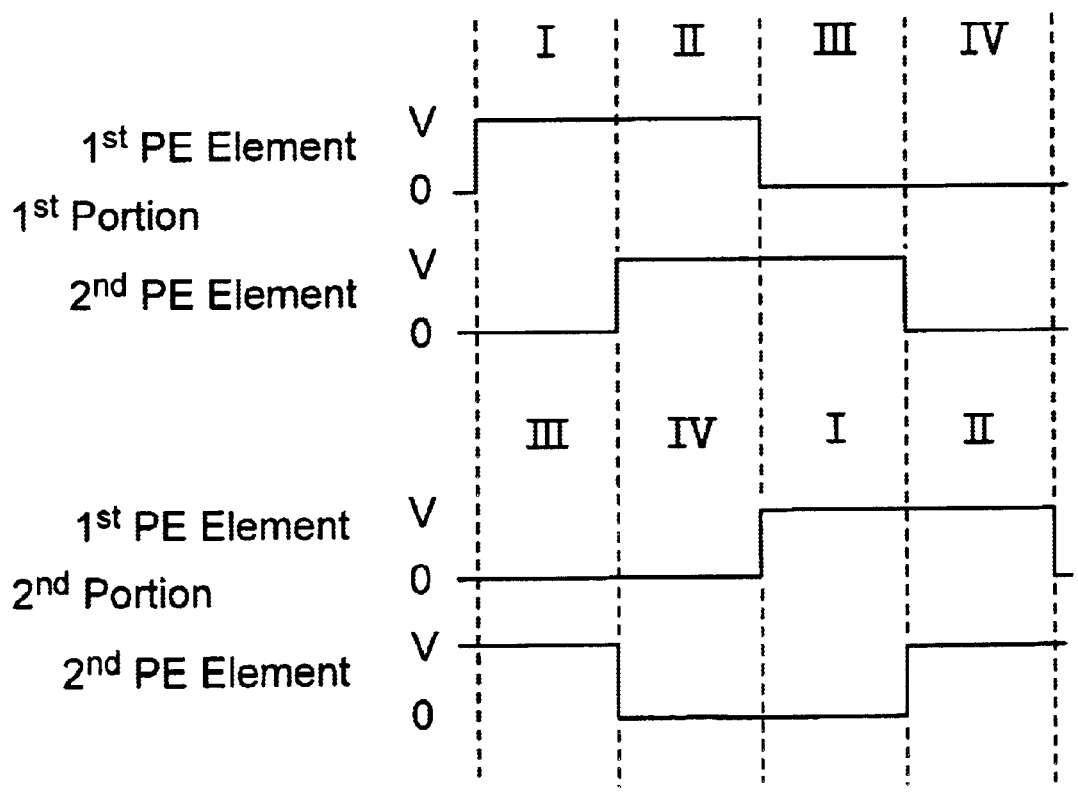
FIG. 3 is a timing chart depicting an exemplary operational timing for the stage-actuator of FIG. 1.

A timing chart for the stage-actuator of FIG. 1 is shown in FIG. 3. In this example, displacements occur whenever respective voltages are applied to both piezoelectric (PE) elements of a particular actuator-portion. The respective voltages and their respective durations can be varied as circumstances indicate. The timing segments apply to the following four statuses, which are repeated as necessary:

Status I: A voltage of the prescribed polarity is applied only to a first piezoelectric element to urge the respective upper surface of the pressure-application member against the surface of the guide bar (left-hand portion of FIG. 2(A), right-hand portion of FIG. 2(C)).

Status II: The slider is moved relative to the guide bar by shear deformation of a second piezoelectric element while a voltage of the prescribed polarity is being applied to both piezoelectric elements of a respective actuator-portion, to push the respective upper surface of the respective pressure-application member against the surface of the guide bar (left-hand portion of FIG. 2(B), right-hand portion of FIG. 2(D)).

Status III: A voltage of the prescribed polarity is applied only to a second piezoelectric element (left-hand portion of FIG. 2(C), right-hand portion of FIG. 2(A)).

Status IV: A voltage is not being applied to either piezoelectric element of either actuator-portion (left-hand portion of FIG. 2(D), right-hand portion of FIG. 2(B)).

The respective actuator-portions of the stage-actuator repeat the four operations represented by the respective statuses I–IV at the prescribed times. As understood from FIG. 3, application of respective voltages to the respective piezoelectric elements of the respective actuator-portions is according to respective half-periods, and the respective periods of actuation of the first piezoelectric elements and of the second piezoelectric elements are offset from each other by ¼ period. In addition, application of respective voltages to the respective piezoelectric elements of the first and second actuator-portions is offset by ½ period (180°). By providing each stage-actuator with two actuator-portions that perform similar movements according to respective timing periods that are offset from each other by ½ period, each stage-actuator effectively moves the stage in a walking "inchworm" manner.

Figure 2D:
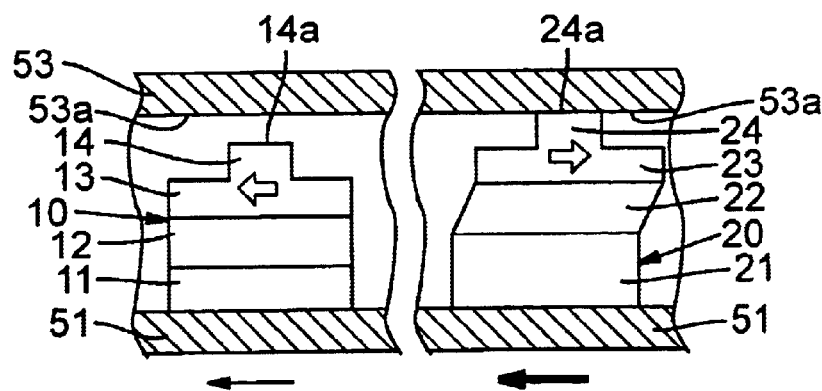

It is possible to increase the period of slider movements (Status II, FIGS. 2(B) and 2(D)), which would allow an increase in the velocity of movement.

Figure 6:
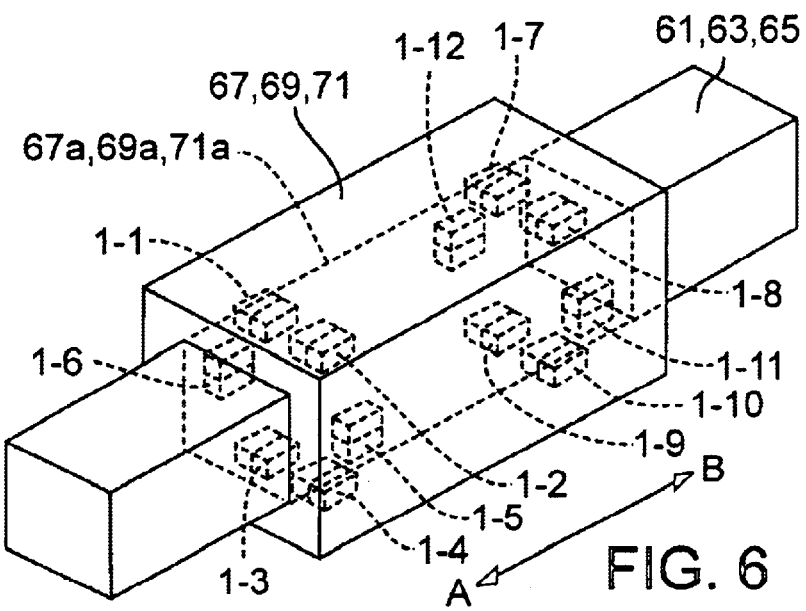
FIG. 6 is an oblique view providing detail of a slider and guide bar used in the stage device of FIGS. 5(A)–5(B).

A representative embodiment of a stage device 60 is shown in FIGS. 5(A)–5(B) and 6. The stage apparatus 60 comprises two fixed guide bars 61, 63 extending parallel to each other in the X-direction and a moving guide bar 65 extending (in the Y-direction) between the fixed guide bars 61, 63. Respective X-sliders 67, 69 are engaged with the guide bars 61, 63. The X-sliders 67, 69 move in the X-direction along their respective guide bars 61, 63. The ends of the moving guide bar 65 are attached to respective side surfaces of the X-sliders 67, 69. A Y-slider 71 is engaged with the moving guide bar 65, and moves in the Y-direction along the moving guide bar 65. A stage 73 or other platform is secured to the "upper" surface of the Y-slider 71. An electrostatic chuck 75, to which a substrate or reticle is held by suction, is mounted on the stage 73. The stage 73 moves in the X-direction by motion of the X-sliders 67, 69 along their respective guide bars 61, 63, and moves in the Y-direction by motion of the Y-slider 71 along its guide bar 65.

As shown in the enlargement provided by FIG. 6, multiple stage-actuators 1-1 to 1-12 are embedded and secured at respective locations in the inner walls of a respective void 67*a*, 69*a*, 71*a* extending longitudinally through the respective slider 67, 69, 71. For example, four respective stage-actuators 1-1, 1-2, 1-7, 1-8 are embedded in the "upper" inner wall just inside the respective opening of the void), and four stage-actuators 1-3, 1-4, 1-9, 1-10 are embedded in the "lower" inner wall Oust inside the respective opening of the void). Furthermore, two respective stage-actuators 1-5, 1-6 and 1-11, 1-12 are embedded in each "left" and "right" side inner surface (just inside the respective opening in the void). In each inner surface, the respective stage-actuators 1 are embedded at a depth allowing the slider to slide relative to the guide bar whenever no voltage is being applied to the respective stage-actuators 1, while preventing the slider from sliding relative to the guide bar whenever a voltage is being applied to the first piezoelectric elements of the respective stage-actuators 1.

As seen in FIG. 6, the respective stage-actuators 1 on each end of the slider are arranged on a respective circle extending around the opposing inner walls of the slider. The respective slider is movable in both directions ("A" direction and "B" direction) in the longitudinal direction of the respective guide bar. The respective second piezoelectric element in each stage-actuator 1 is configured such that the respective direction of its shear deformation depends upon the polarity of the applied voltage. Hence, to advance the slider in the "A" direction, a voltage is applied to the second piezoelectric element of the stage-actuator 1 so that shear deformation thereof is in the "B" direction. On the other hand, to advance the slider in the "B" direction, a voltage is applied to the second piezoelectric element of the stage-actuator 1 so that shear deformation thereof is in the "A" direction.

During stage movement, the respective stage-actuators are controlled by the controller 115, and the X-sliders and Y-slider are moved the prescribed distance in the prescribed direction (as controlled by the controller). To achieve such motion, all stage-actuators in the stage must operate in a coordinated and cooperative manner.

By providing multiple stage-actuators on each slider, the respective slider is movable relative to its guide bar(s) at a prescribed velocity over the prescribed distance, allowing very accurate and precise movements and positionings of the stage.

To achieve the required stage-movement velocity, the applied voltages and frequencies with which the voltages are applied to the respective piezoelectric elements may be increased or decreased accordingly. To achieve the required stage-movement acceleration, the applied voltages to the respective piezoelectric elements or the number of stage-actuators arranged and used may be increased or decreased accordingly.

Stage-movement velocity (v) is expressed by the following equation:

$$v = \alpha \cdot E \cdot d_{15} \cdot f \cdot n$$

wherein $\alpha$ is a transmission coefficient, E is the applied voltage, $d_{15}$ is a shear-equivalence piezoelectric constant, f is drive frequency, and n is the number of piezoelectric-body laminations per piezoelectric element.

Stage-movement acceleration (a) is expressed by the following equation:

$$a = N \cdot F_s / M$$

wherein N is the number of stage-actuators, $F_s$ is shear-generation force, and M is stage mass.

These various parameters are listed in Table 1.

TABLE 1

| Parameter | Symbol | Units | Value |
|---|---|---|---|
| Transmission coeff. | ($\alpha$) | — | 0.111 |
| Applied voltage | (E) | V | 100 |
| Shear equiv. (PE const) | ($d_{15}$) | nm/V | 0.75 |
| Drive frequency | (f) | kHz | 180 |
| # PE-element laminae | (n) | — | 8 |
| # stage-actuators | (N) | — | 12 |
| Shear-deformation force | ($F_s$) | N | 67.28 |
| Stage mass | (M) | Kg | 20 |
| Stage velocity | (v) | m/s | 1.2 |
| Stage max. acceleration | (a) | m/s$^2$ | 4.1 |

As shown in Table 1, in a stage device satisfying these conditions, it is possible to achieve a stage-movement velocity of 1.2 m/s and a stage-acceleration of 10.1 m/s$^2$.

Figure 7A:
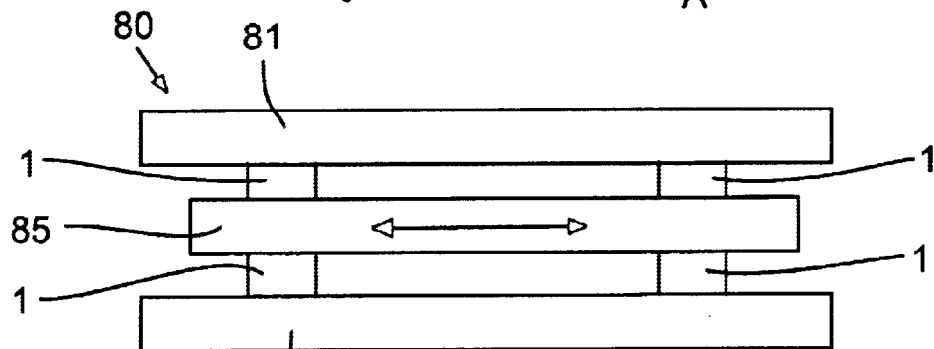
FIGS. 7(A)–7(B) are an elevational view and oblique view, respectively, of a portion of a second representative embodiment of a stage device.
Figure 7B:
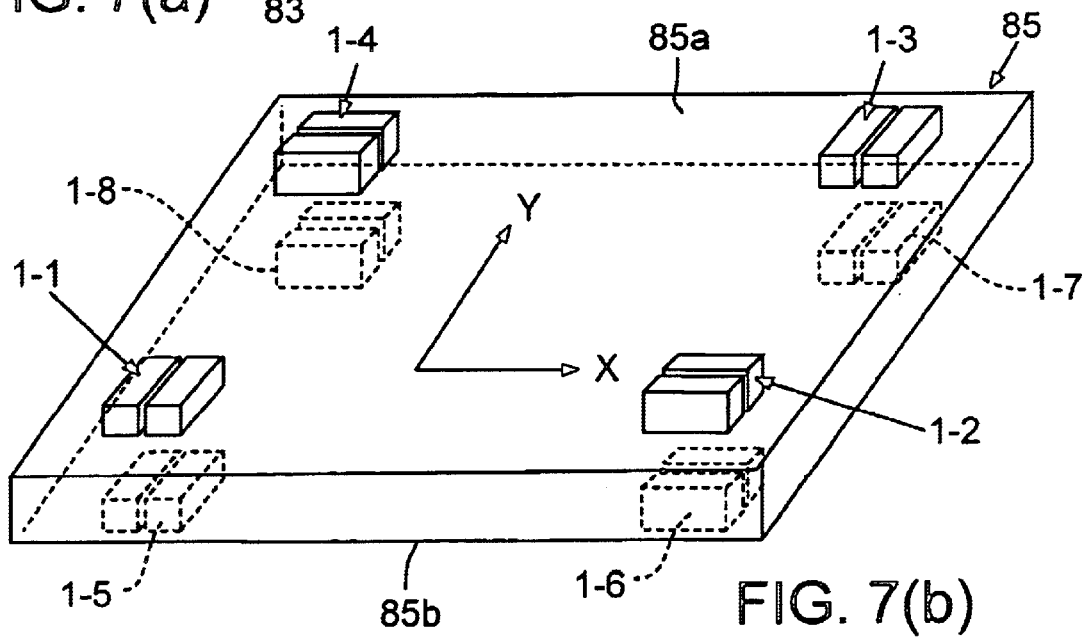

FIGS. 7(A)–7(B) depict a stage device 80 according to a second representative embodiment. The subject stage device 80 comprises two fixed guide plates 81, 83 and a slider plate 85 situated between the fixed guide plates 81, 83. The fixed guide plates 81, 83 have respective planar surfaces that face each other and are parallel to each other. A respective stage-actuator 1-1, 1-2, 1-3, 1-4, such as shown in FIG. 1, is situated at each corner of the "upper" surface 85a of the slider plate 85, and a respective stage-actuator 1-5, 1-6, 1-7, 1-8 is situated at each corner of the "under" surface 85b of the slider plate 85. A pair of stage-actuators 1-1 and 1-3, positioned on one of the diagonals of the slider plate 85, has the same respective movement direction. Similarly, a pair of stage-actuators 1-2 and 1-4, positioned on the other of the diagonals, has the same respective movement direction. (A similar relationship exists among the stage-actuators 1-5 to 1-8 on the under-surface 85b) Moreover, the respective movement directions of the stage-actuators 1-1, 1-3 and 1-2, 1-4 are perpendicular to each other. (A similar relationship exists among the stage-actuators 1-5 to 1-8 on the under-surface 85b.) The positional relationships of the respective stage-actuators at each of the "upper" surface and "lower" surface of the slider plate 85 are the same at each corner.

To move the slider plate 85 in the X-direction relative to the guide plates 81, 83, only the stage-actuators 1-2, 1-4, 1-6, 1-8 are energized. To move the slider plate 85 in the Y-direction relative to the guide plates 81, 83, only the stage-actuators 1-1, 1-3, 1-5, 1-7 are energized.

In this embodiment, all stage-actuators that move in the same direction are caused to operate at the same timing to enable moving of the slider the prescribed distance with respect to the respective guide plates. This planar-type "motor" is especially useful, for example, in the X-Y stages of CPB microlithography systems.

As discussed above, stage devices are provided that include non-magnetic stage-actuators each comprising piezoelectric elements. The stage devices are inexpensive and compact, and exhibit high positioning accuracy and precision, and operate with an acceptable velocity and acceleration. When such a stage device is used for moving a stage in a microlithography system, the system is able to perform pattern transfer with greater accuracy and precision than conventionally.

Whereas the invention has been described in connection with several representative embodiments, the invention is not limited to those embodiments. On the contrary, the inventions is intended to encompass all modifications, alternatives, and equivalents as may be included within the spirit and scope of the invention, as defined by the appended claims.

What is claimed is:

1. A stage device, comprising:
   a guide bar having a longitudinal dimension;
   a slider that is movable in the longitudinal dimension as guided by the guide bar and that is positionable along the longitudinal dimension of the guide bar;
   a stage mounted to the slider; and
   multiple stage-actuators attached to the slider and extending toward a guide surface of the guide bar, the stage-actuators being operable in a coordinated manner to cause motion of the slider, relative to the guide bar, in a stage-movement direction parallel to the longitudinal dimension;
   each stage-actuator comprising a first piezoelectric element, a second piezoelectric element, and a pressure-application member having a contact surface and being movable by changes in shape of either or both the first and second piezoelectric elements;
   the first piezoelectric element being configured to expand, when electrically energized, in a manner that moves the pressure-application member toward the guide surface so as to cause the contact surface to contact the guide surface, and to retract, when the first piezoelectric element is electrically de-energized, the pressure-application member away from the guide surface;
   the second piezoelectric element being configured to exhibit, when electrically energized, a shear deformation that displaces the pressure-application member and contact surface in the stage-movement direction, and not to exhibit, when electrically de-energized, the shear deformation;
   the first and second piezoelectric elements being independently energizable in a coordinated manner so as to cause the contact surface periodically to contact and not contact the guide surface in a walking manner that urges movement of the slider relative to the guide bar in the stage-movement direction.

2. The stage device of claim 1, wherein the stage-actuators are arranged in pairs that are operated cooperatively to cause their respective contact surfaces to exhibit a coordinated walking motion relative to the guide surface.

3. The stage-device of claim 2, wherein each of the stage-actuators in each pair is energized in an operational sequence that is 180° out of phase with the operational sequence of the other stage-actuator.

4. The stage-device of claim 3, wherein, in each of the stage-actuators in each pair, the first and second piezoelectric elements are energized in respective operational sequences that are 90° out of phase with each other.

5. The stage-device of claim 1, wherein, with respect to each of the stage-actuators, the first piezoelectric element is mounted to the slider, the second piezoelectric element is mounted to the first piezoelectric element, and the pressure-application member is mounted to the second piezoelectric element.

6. The stage-device of claim 5, wherein, with respect to each of the stage-actuators, the first piezoelectric element, second piezoelectric element, and pressure-application member are superposedly stacked relative to each other.

7. The stage device of claim 1, wherein:
   the guide bar defines two opposing guide surfaces extending in the longitudinal dimension;
   the slider moves along and is guided by both guide surfaces;
   the stage-actuators are arranged in pairs each consisting of a respective two stage-actuators; and
   at least one pair of stage-actuators is situated so as to perform a respective walking movement of the slider along each respective guide surface.

8. The stage device of claim 7, wherein each of the stage-actuators in each pair is energized in an operational sequence that is 180° out of phase with the operational sequence of the other stage-actuator of the pair.

9. The stage device of claim 7, further comprising multiple pairs of stage-actuators situated so as to perform respective coordinated walking movements of the slider along each respective guide surface.

10. The stage device of claim 7, wherein each stage-actuator is affixed to a respective region on a surface of the slider opposite a respective region on the guide surface.

11. The stage device of claim 1, further comprising multiple guide bars and respective sliders, wherein:
    each guide bar has a respective longitudinal dimension; and
    each slider is movable in the longitudinal dimension of the respective guide bar as guided by the respective guide bar and is positionable along the longitudinal dimension of the respective guide bar.

12. The stage device of claim 11, further comprising multiple said stage-actuators attached to each slider and extending toward the guide surface of the respective guide bar, the stage-actuators being operable in a coordinated manner to cause motion of the slider, relative to the respective guide bar, in a stage-movement direction parallel to the respective longitudinal dimension.

13. The stage device of claim 12, wherein at least two of the multiple guide bars are parallel to each other.

14. The stage device of claim 12, wherein the respective longitidinal dimension of at least one guide bar is orthogonal to the respective longitudinal dimension of another of the guide bars.

15. A planar stage-device, comprising:
    a planar first guide plate defining a respective guide surface extending in a respective guide plane;
    a slider plate movable in the guide plane relative to the first guide plate as guided by the first guide plate;
    a stage mounted to the slider plate; and
    multiple stage-actuators attached to the slider plate and extending toward the guide surface of the first guide plate such that the stage-actuators are situated between the slider plate and the first guide plate, the stage-actuators being operable in a coordinated manner to cause motion of the slider plate, relative to the first guide plate, in a stage-movement direction in the guide plane;
    each stage-actuator comprising a first piezoelectric element, a second piezoelectric element, and a pressure-application member having a contact surface and being movable by changes in shape of either or both the first and second piezoelectric elements;
    the first piezoelectric element being configured to expand, when electrically energized, in a manner that moves the pressure-application member toward the guide surface so as to cause the contact surface to contact the guide surface, and to retract, when the first piezoelectric element is electrically de-energized, the pressure-application member away from the guide surface;
    the second piezoelectric element being configured to exhibit, when electrically energized, a shear deformation that displaces the pressure-application member and contact surface in the stage-movement direction, and not to exhibit, when electrically de-energized, the shear deformation;

the first and second piezoelectric elements being independently energizable in a coordinated manner so as to cause the contact surface periodically to contact and not contact the guide surface in a walking manner that urges movement of the slider plate relative to the first guide plate.

16. The stage device of claim 15, wherein the stage-actuators are arranged in pairs that are operated cooperatively to cause their respective contact surfaces to exhibit a coordinated walking motion relative to the guide surface.

17. The stage-device of claim 16, wherein each of the stage-actuators in each pair is energized in an operational sequence that is 180° out of phase with the operational sequence of the other stage-actuator.

18. The stage-device of claim 17, wherein, in each of the stage-actuators in each pair, the first and second piezoelectric elements are energized in respective operational sequences that are 90° out of phase with each other.

19. The stage-device of claim 15, wherein, with respect to each of the stage-actuators, the first piezoelectric element is mounted to the slider plate, the second piezoelectric element is mounted to the first piezoelectric element, and the pressure-application member is mounted to the second piezoelectric element.

20. The stage-device of claim 19, wherein, with respect to each of the stage-actuators, the first piezoelectric element, second piezoelectric element, and pressure-application member are superposedly stacked relative to each other.

21. The stage device of claim 15, further comprising a second planar guide plate defining a respective guide surface extending parallel to and facing the guide surface of the first guide plate, wherein the slider plate is situated between the respective guide surfaces of the first and second guide plates.

22. The stage device of claim 21, wherein:
the slider plate has a first surface facing the guide surface of the first guide plate, and a second surface facing the guide surface of the second guide plate; and
each of the first and second guide surfaces of the slider plate has mounted thereto multiple stage-actuators that are situated and configured to perform, in a coordinated manner, walking movements of the slider plate relative to the first and second guide plates.

23. The stage device of claim 22, wherein:
the stage-actuators are arranged in pairs each consisting of a respective two stage-actuators; and
at least one pair of stage-actuators is situated so as to perform a respective walking movement of the slider plate along the respective guide surface.

24. The stage device of claim 23, wherein each of the stage-actuators in each pair is energized in an operational sequence that is 180° out of phase with the operational sequence of the other stage-actuator of the pair.

25. The stage device of claim 23, wherein each of the first and second surfaces of the slider plate comprises multiple pairs of stage-actuators situated so as to perform respective coordinated walking movements of the slider plate relative to the first and second guide plates.

26. The stage device of claim 25, wherein:
the guide plane extends in the X- and Y-directions; and
on each of the first and second surfaces of the slider plate, a first set of the multiple pairs of stage-actuators is situated so as to move the slider plate in the X-direction, and a second set of the multiple pairs of stage-actuators is situated so as to move the slider plate in the Y-direction.

27. A microlithography system that selectively irradiates an energy beam onto a sensitive substrate to form a pattern, the system comprising a stage device as recited in claim 1.

28. The microlithography system of claim 27, wherein the stage is selected from the group consisting of reticle stages and substrate stages.

29. A microlithography system that selectively irradiates an energy beam onto a sensitive substrate to form a pattern, the system comprising a stage device as recited in claim 15.

30. The microlithography system of claim 29, wherein the stage is selected from the group consisting of reticle stages and substrate stages.

* * * * *

UNITED STATES PATENT AND TRADEMARK OFFICE
CERTIFICATE OF CORRECTION

PATENT NO.     : 6,838,808 B2
DATED          : January 4, 2005
INVENTOR(S)    : Keiichi Tanaka It is certified that error appears in the above-identified patent and that said Letters Patent is hereby corrected as shown below:

Column 4,
Line 18, ", as stage," should be -- , a stage, --.

Column 11,
Line 2, "Oust" should be -- just --.

Column 12,
Line 64, "inventions" should be -- invention --.

Signed and Sealed this

Twenty-fourth Day of May, 2005

JON W. DUDAS
*Director of the United States Patent and Trademark Office*